United States Patent
Chueh et al.

(10) Patent No.: US 10,115,848 B2
(45) Date of Patent: Oct. 30, 2018

(54) METHOD OF TRANSFERRING THIN FILM

(71) Applicant: NATIONAL TSING HUA UNIVERSITY, Hsinchu (TW)

(72) Inventors: Yu-Lun Chueh, Hsinchu (TW); Kuan-Chun Tseng, Hsinchu (TW); Yu-Ting Yen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/275,705

(22) Filed: Sep. 26, 2016

(65) Prior Publication Data
US 2017/0092794 A1    Mar. 30, 2017

(30) Foreign Application Priority Data
Sep. 25, 2015 (TW) .............................. 104131790 A

(51) Int. Cl.
| | | |
|---|---|---|
| *H01L 31/046* | (2014.01) | |
| *H01L 31/18* | (2006.01) | |
| *H01L 31/032* | (2006.01) | |

(52) U.S. Cl.
CPC ........ *H01L 31/0322* (2013.01); *H01L 31/046* (2014.12); *H01L 31/1896* (2013.01); *Y02E 10/541* (2013.01)

(58) Field of Classification Search
None
See application file for complete search history.

(56) References Cited

U.S. PATENT DOCUMENTS

| | | | | |
|---|---|---|---|---|
| 6,099,389 A | * | 8/2000 | Nichols | B24B 1/00 451/34 |
| 9,082,881 B1 | * | 7/2015 | Hackler, Sr. | H01L 21/84 |
| 2002/0058462 A1 | * | 5/2002 | Oliver | H01L 21/31053 451/36 |
| 2011/0020978 A1 | * | 1/2011 | Wieting | C03C 17/002 438/93 |
| 2011/0108099 A1 | * | 5/2011 | Pinarbasi | H01L 31/022466 136/255 |
| 2013/0115860 A1 | * | 5/2013 | Stern | B24B 7/228 451/41 |
| 2013/0334522 A1 | * | 12/2013 | Kang | H01L 21/02565 257/43 |
| 2015/0243548 A1 | * | 8/2015 | Miscione | H01L 21/76251 257/349 |

FOREIGN PATENT DOCUMENTS

| | | |
|---|---|---|
| TW | 201041164 A1 | 11/2010 |
| TW | 201123467 A1 | 7/2011 |

* cited by examiner

*Primary Examiner* — Charles D Garber
*Assistant Examiner* — Xiaoming Liu
(74) *Attorney, Agent, or Firm* — Li & Cai Intellectual Property (USA) Office

(57) ABSTRACT

A method of transferring a thin film includes: providing a first element structure, wherein the first element structure includes a first substrate and a functional film layer formed on the first substrate; completely removing the first substrate, wherein steps of the completely removing the first substrate includes: conducting an etching step to erode the first substrate, and conducting a grinding step to planarize the eroded first substrate; and after completely removing the first substrate, attaching the functional film layer on a second substrate to form a second element structure.

9 Claims, 7 Drawing Sheets

METHOD OF TRANSFERRING THIN FILM

BACKGROUND OF THE INVENTION

1. Field of the Invention

The instant disclosure relates to a method of transferring a thin film; in particular, to a method of transferring a thin film of an optoelectronic element from a growth substrate to other substrates.

2. Description of Related Art

Thin film solar cells are currently of great potential for energy development projects. The thin film solar cell with a light absorbing layer having a thickness of 2 µm can provide a light energy conversion efficiency of 10 to 20%, so as to effectively decrease material consumption. Since the thin film solar cell has the thin film feature, it can be adapted to flexible substrates and portable equipment. However, the temperature of manufacturing the light absorbing layer of the thin film solar cell is above 600° C., thus the light absorbing layer cannot be deposited on a flexible substrate which has a lower heat resistance, which limits applications of the thin film solar cell.

In the prior art, a manufacturing process at a relatively low temperature has been developed to form the thin film solar cell on different flexible substrates. But, in the current manufacturing process of forming a CIGS light-absorbing layer, reducing the temperature of the substrate is limited. In addition, CIGS light-absorbing layer being manufactured at the relatively low temperature has inferior quality and light energy conversion efficiency. Therefore, the CIGS light-absorbing layer manufactured at the relatively low temperature needs to conduct a selenide annealing treatment (annealing temperature is at least 550° C.), so as to have a superior light energy conversion efficiency.

SUMMARY OF THE INVENTION

An embodiment of this instant disclosure provides a method of transferring a thin film. The method of transferring a thin film of the embodiment of this instant disclosure can be used to transfer the thin film solar cell which is previously formed on a soda glass substrate. For instance, on a flexible substrate. Accordingly, the thin film solar cell can be formed on different flexible substrates to increase applications of the thin film solar cell.

One embodiment of this instant disclosure provides a method of transferring a thin film. Firstly, a first element structure is provided, wherein the first element structure includes a first substrate and a functional film layer formed on the first substrate. Then, the first substrate is completely removed. Steps of completely removing the first substrate include: conducting an etching step and a grinding step. The etching step is used to erode the first substrate, the grinding step is used to planarize the eroded first substrate, and the first substrate is completely removed. After completely removing the first substrate, the functional film layer is attached on a second substrate to form a second element structure.

In summary, the method of transferring a thin film of this instant disclosure can be widely applied in different fields. For example, in an application of a thin film solar cell, a solar cell layer being previously formed on the soda glass substrate can be transferred onto any flexible substrate. By the method of transferring a thin film of the embodiment of this instant disclosure, the solar cell layer can be formed on a variety of different substrates, so as to increase applications of the thin film solar cell.

Furthermore, in the embodiment of this instant disclosure, the solar cell layer is formed on the relatively high temperature resistant soda glass substrate first, and the solar cell layer is transferred to the flexible substrate. Therefore, compared to the solar cell layer being formed at low temperature, the solar cell layer of the embodiment of this instant disclosure has superior quality.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Embodiments disclosed in the instant disclosure are illustrated via specific examples as follows, and people familiar in the art may easily understand the advantages and efficacies of the instant disclosure by disclosure of the specification. The instant disclosure may be implemented or applied by other different specific examples, and each of the details in the specification may be applied based on different views and may be modified and changed under the existence of the spirit of the instant disclosure. The figures in the instant disclosure are only for brief description, but they are not depicted according to actual size and do not reflect the actual size of the relevant structure. The following embodiments further illustrate related technologies of the instant disclosure in detail, but the scope of the instant disclosure is not limited herein.

Figure 1:
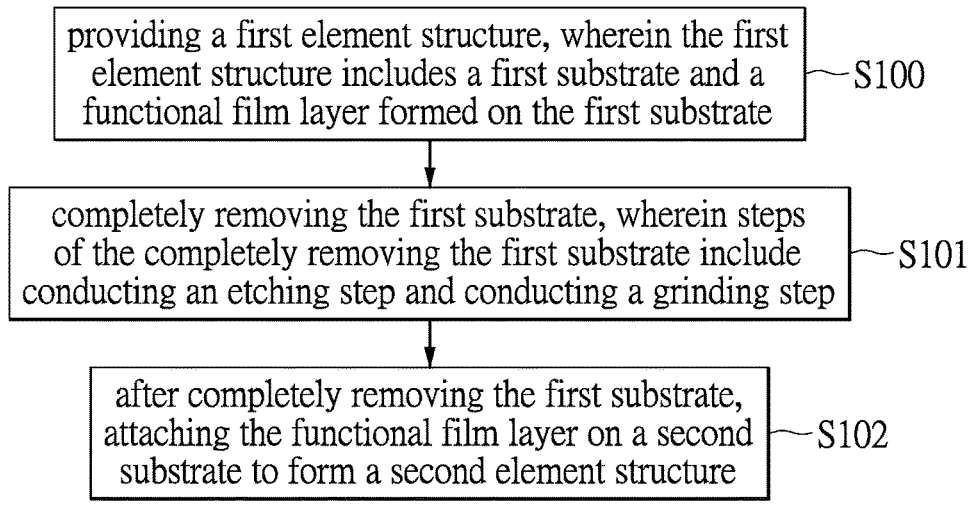
FIG. 1 shows a flow chart of a method of transferring a thin film of an embodiment in the instant disclosure.

A method of transferring a thin film of an embodiment of this instant disclosure can be used in different technical fields, for example, transferring a thin film solar cell, a diode element, an organic light emitting element, or a transistor element from an initial substrate to a flexible substrate, so as to expand applications of the elements. In this instant disclosure, the thin film solar cell is an example for illustrating the method of transferring a thin film. Please refer to FIG. 1. FIG. 1 shows a flow chart of a method of transferring a thin film of the embodiment in the instant disclosure.

Figure 2A:
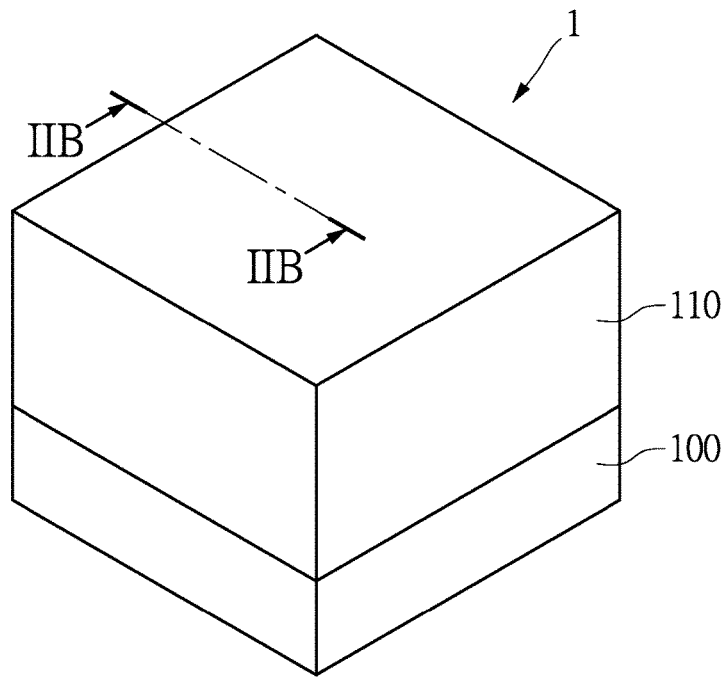
FIG. 2A shows a perspective schematic view of a functional film layer on a first substrate of an embodiment in the instant disclosure.

In step S100, a first element structure 1 is provided, wherein the first element structure 1 includes a first substrate 100 and a functional film layer 110 formed on the first substrate 100. In detailed description, please refer to FIG. 2A. FIG. 2A shows a perspective schematic view of a functional film layer 110 on the first substrate 100 of the embodiment in the instant disclosure.

As shown in FIG. 2A, the first element structure 1 includes the first substrate 100 and the functional film layer 110 formed on the first substrate 100.

The first substrate 100 may be a rigid substrate or a soft substrate, in actual practice, a material of the first substrate 100 may be chosen from glass, acrylic, metal, ceramic, and/or plastic, and it is not limited in this instant disclosure. For instance, when the functional film layer 110 is formed at a relatively high temperature (about 400 to 800° C.), the material of the first substrate 100 may use a rigid substrate which has a high temperature resistance, such as glass. In addition, the functional film layer 110 may be a solar cell layer, an organic light emitting layer, a diode element layer, or a transistor element layer. Examples of the solar cell layer include, but are not limited to cadmium telluride (CdTe) solar cell layer, copper indium gallium selenide (CIGS) solar cell layer, silicon thin film solar cell layer, organic solar cell layer, and III-V solar cell layer.

Figure 2B:
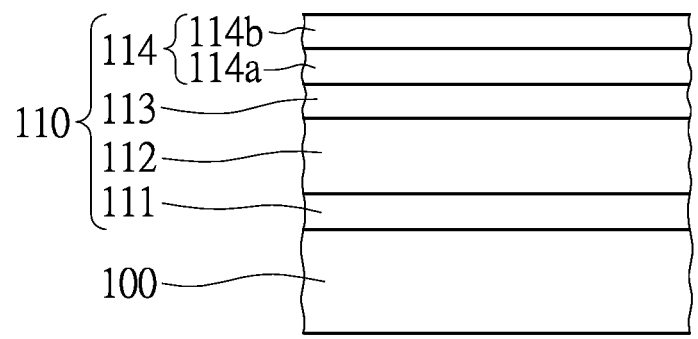
FIG. 2B shows a cross-sectional schematic view taken along section line IIB-IIB of FIG. 2A of an embodiment in the instant disclosure.

In this embodiment of the instant disclosure, the functional film layer 110 being a CIGS solar cell layer is an example for illustration. Please refer to FIG. 2B. FIG. 2B shows a cross-sectional schematic view taken along section line IIB-IIB of FIG. 2A of the embodiment in the instant disclosure.

In this embodiment of this instant disclosure, the functional film layer 110 includes a back electrode layer 111, a light absorbing layer 112, a buffer layer 113, and a transparent conductive layer 114, wherein the light absorbing layer 112 is disposed between the back electrode layer 111 and the transparent conductive layer 114, and the buffer layer 113 is disposed between the light absorbing layer 112 and the transparent conductive layer 114. That is, when forming the functional film layer 110, the back electrode layer 111, the light absorbing layer 112, the buffer layer 113, and the transparent conductive layer 114 are sequentially formed on the first substrate 100.

Examples of a material of the back electrode layer 111 include, but are not limited to, molybdenum, aluminum, silver, copper, nickel, palladium or an alloy thereof. The light absorbing layer 112 is a copper indium gallium selenide layer (p-Cu(InGa)Se$_2$), the buffer layer 113 may be a sulfide layer such as cadmium sulfide (CdS) or zinc sulphide (ZnS). The transparent conductive layer 114 includes an intrinsic layer 114a and a conductive layer 114b, wherein the intrinsic layer 114a may be an undoped zinc oxide layer, and the conductive layer 114b may be an aluminum doped zinc oxide layer.

Furthermore, in this embodiment of the instant disclosure, the first substrate 100 is a soda glass substrate. During a process of manufacturing the CIGS solar cell layer, sodium ions in the soda glass substrate diffuse to the solar cell layer to increase a conversion efficiency of the solar cell layer.

Figure 2C:
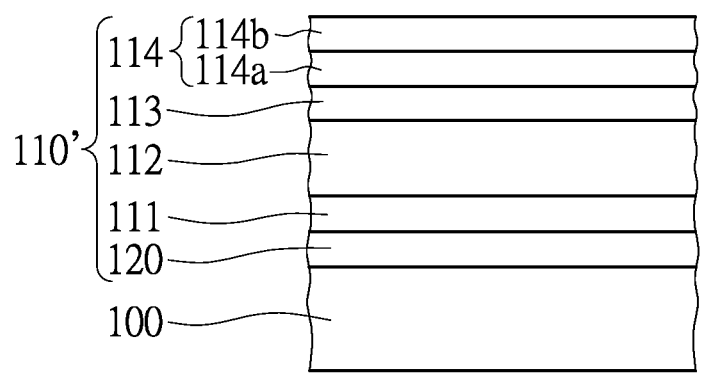
FIG. 2C shows a cross-sectional schematic view of a functional film layer sequentially formed on a first substrate of another embodiment in the instant disclosure.

Please refer to FIG. 2C. FIG. 2C shows a cross-sectional schematic view of the functional film layer 110 sequentially formed on the first substrate 100 of another embodiment in the instant disclosure. In this embodiment and the FIG. 2B embodiment, the same elements have the same numbers and symbols.

In the FIG. 2C embodiment, the functional film layer 110' further includes a salt containing layer 120, such as sodium fluoride layer, sodium silicide layer, or sodium sulfide layer. The salt containing layer 120 is formed between the first substrate 100 and the back electrode layer 111, and has similar efficacies with the soda glass substrate in the previous embodiment. That is, during the process of manufacturing the CIGS solar cell layer, the sodium ions in the salt containing layer 120 also diffuse to the solar cell layer to increase the conversion efficiency of the solar cell layer. In this embodiment, the first substrate 100 does not have to be the soda glass substrate, and a general glass or a material having high temperature resistance can be used.

Figure 3:
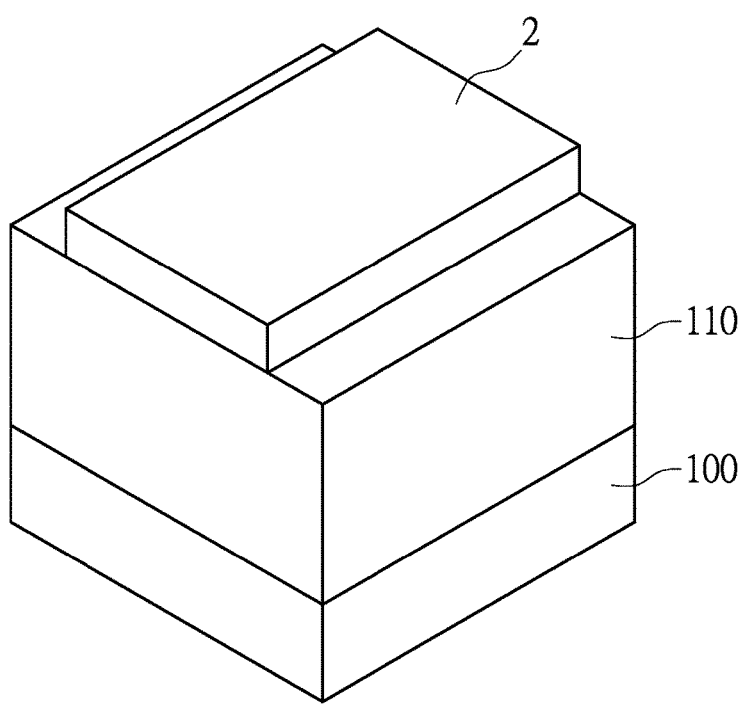
FIG. 3 shows a perspective schematic view of a functional film layer attached on a supporting material in a method of transferring a thin film of an embodiment in the instant disclosure.

After the step S100, the method of transferring a thin film of this embodiment further includes a step of attaching a supporting material 2 on the first element structure 1. Please refer to FIG. 3. FIG. 3 shows a perspective schematic view of the functional film layer 110 attached on the supporting material 2 in a method of transferring a thin film of the embodiment in the instant disclosure.

In the FIG. 3 embodiment, the supporting material 2 is attached on the functional film layer 110 by an adhesive material. In this embodiment, the supporting material 2 and the first substrate 100 are respectively located at two opposite sides of the functional film layer 110. In an embodiment, the supporting material 2 may be a material of a certain strength, e.g., a quartz sheet, a ceramic sheet, a plastic sheet, or a metal sheet. Examples of the adhesive material include, but are not limited to, hot-melt adhesive, light-curing adhesive, or heat curing adhesive.

Furthermore, in an embodiment, the binding force between the adhesive material and the supporting material 2 is best to be larger than the binding force between the adhesive material and the functional film layer 110, such that, when the supporting material 2 is removed from the functional film layer 110 in a subsequent manufacturing process, the adhesive material does not cause damage to the functional film layer 110.

It should be noted that, the supporting material 2 is a temporary substrate, and it is used to support the functional film layer 110 during removal of the first substrate 100. Thus, a material used for the supporting material 2 should be able to provide a supporting force to the functional film layer 110. The material used for the supporting material 2 and the positions where the supporting material 2 is attached on the functional film layer 110 are not limited herein and can be modified depending on actual requirements. For example, when the functional film layer 110 is thick enough, the supporting material 2 can be attached on a side surface of the functional film layer 110.

Please refer to FIG. 1 again. In step S101, the first substrate 100 is completely removed, wherein the step of the first substrate 100 being completely removed includes conducting an etching step and a grinding step. Specifically, in the etching step, the first substrate 100 is eroded by an etchant 32, so as to separate the first substrate 100 and the functional film layer 110.

Figure 4:
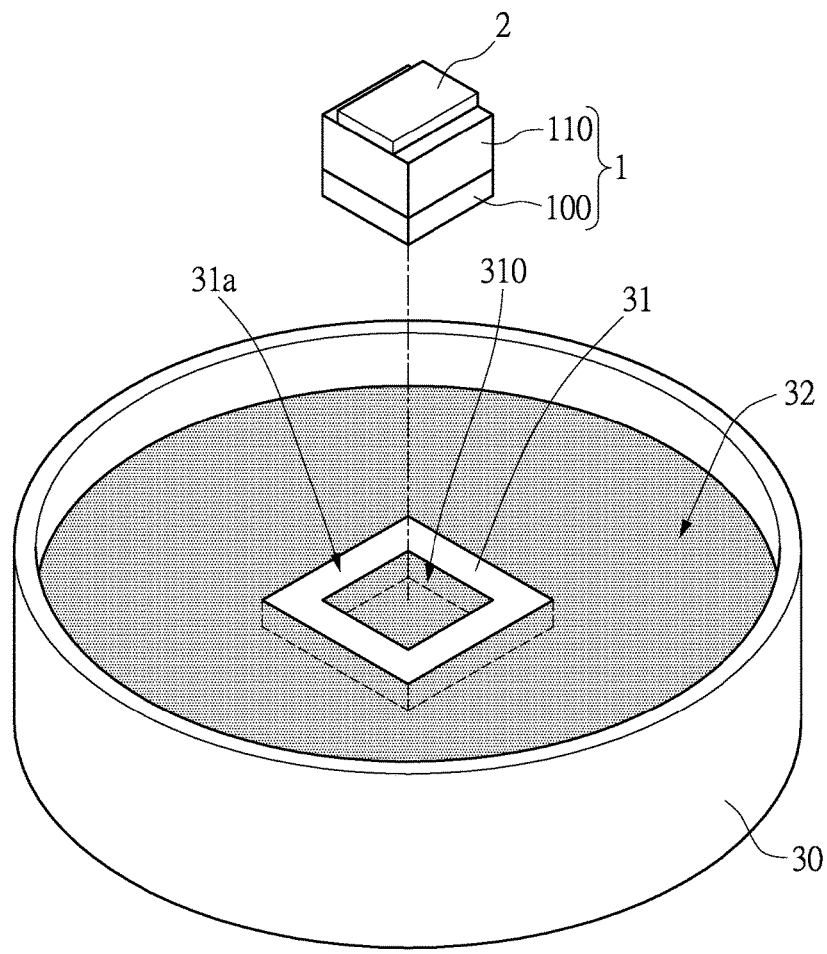
FIG. 4 shows a perspective schematic view of a first substrate being etched in a method of transferring a thin film of an embodiment in the instant disclosure.

In this embodiment, the etching step is a wet etching process. Please refer to FIG. 4. FIG. 4 shows a perspective schematic view of the first substrate 100 being etched in the method of transferring a thin film of the embodiment in the instant disclosure. As shown in FIG. 4, an etching bath 30 and a stage 31 are provided. The stage 31 is disposed in the etching bath 30, and has a bearing surface 31a and an opening 310 formed on the bearing surface 31a. The etchant 32 is received in the etching bath 30 and the opening 310.

When conducting the etching step, a structure formed by the first element structure 1 and the supporting material 2 is placed on the stage 31 in the etching bath 30, wherein the first substrate 100 is disposed facing to the bearing surface 31a. When the first element structure 1 is placed on the stage 31, the opening 310 is covered. By a height difference between the stage 31 and a bottom of the etching bath 30, the etchant 32 received in the etching bath 30 and the opening 310 can contact with the first substrate 100 to only etch the first substrate 100, such that a side of the functional film layer 110 can avoid being eroded. The etchant 32 can be selected depending on the first substrate 100. For example, when the first substrate 100 is a glass, the etchant 32 can be hydrofluoric acid.

It should be noted that, during the etching step, there are different etching rates on different positions of the first substrate 100. That is, some positions of the first substrate 100 may be etched faster, and the functional film layer 110 is damaged before the first substrate 100 is completely removed. In some embodiments, an etch stop layer or a sacrificial layer may be formed on the first substrate 100 before the functional film layer 110 is formed on the first substrate 100, so as to avoid the functional film layer 110 being eroded reducing the quality of the functional film layer 110.

However, in some embodiments, in consideration of manufacturing temperatures, cost, and efficacies, the etch stop layer or the sacrificial layer is not formed on the first substrate 100 before the functional film layer 110 is formed on the first substrate 100. For instance, a manufacturing temperature of the CIGS solar cell layer is above 500° C., but some etch stop layers or some sacrificial layers cannot withstand such high temperature. Additionally, when the first substrate 100 is the soda glass substrate, an etch stop layer, a release layer, or a sacrificial layer being formed between the first substrate 100 and the functional film layer 110 may cause sodium ions in the soda glass substrate not being able to diffuse into the CIGS solar cell layer, so as to cause a photoelectric conversion efficiency of the CIGS solar cell layer being below expectation.

Therefore, without forming the etch stop layer or the sacrificial layer, after conducting the etching step for a predetermined time, the grinding step is used to planarize the unremoved first substrate 100, and the etching step is repeated. In this way, the etching rates on different positions of the first substrate 100 can be controlled to have substantially the same speed, so as to avoid the etchant 32 eroding the functional film layer 110.

That is, in an embodiment, the etching step and the grinding step are alternatively and repeatedly conducted until the first substrate 100 is completely removed. The abovementioned grinding step is a chemical mechanical polishing process. In another embodiment, the etching step and the grinding step also can be conducted at the same time to achieve a similar efficacy.

Figure 5:
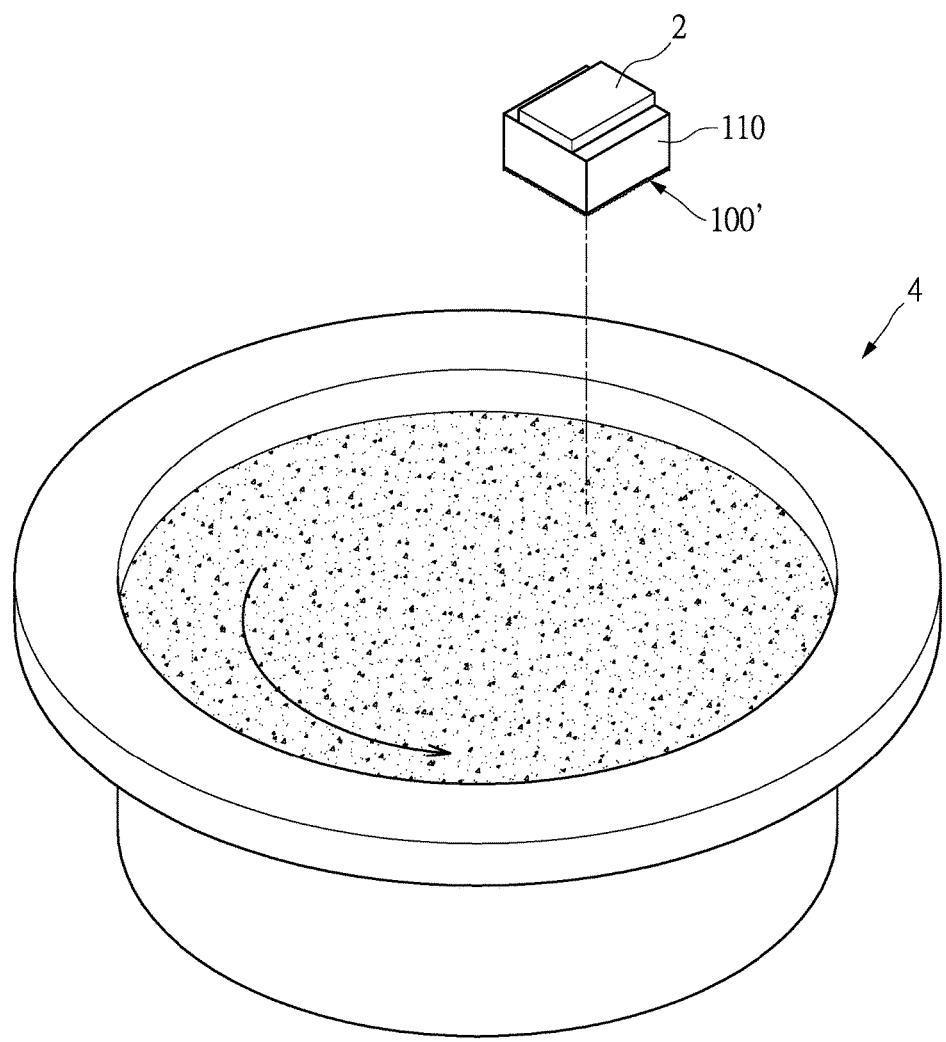
FIG. 5 shows a perspective schematic view of a first substrate being ground in a method of transferring a thin film of an embodiment in the instant disclosure.

Please refer to FIG. 5. FIG. 5 shows a perspective schematic view of a first substrate 100' being ground in the method of transferring a thin film of the embodiment in the instant disclosure. As shown in FIG. 5, a grinding machine 4 can be used to polish or completely remove an eroded first substrate 100' located below the functional film layer 110.

Figure 6:
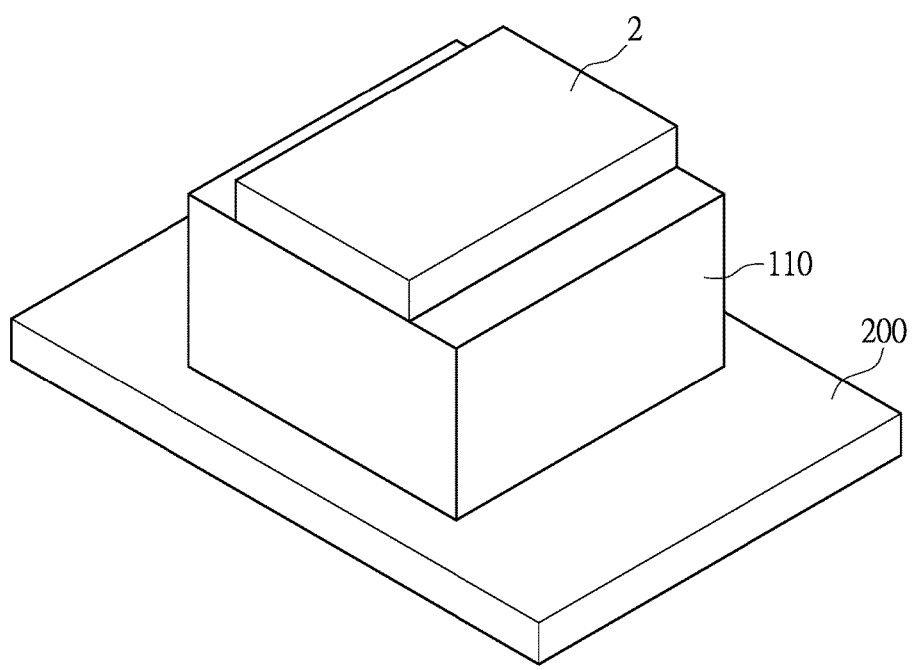
FIG. 6 shows a perspective schematic view of a functional film layer being fixed on a second substrate in a method of transferring a thin film of an embodiment in the instant disclosure.

Please refer to FIG. 1 again and refer to FIG. 6. FIG. 6 shows a perspective schematic view of the functional film layer 110 being fixed on a second substrate 200 in the method of transferring a thin film of the embodiment in the instant disclosure. In step S102, after the first substrate 100 is completely removed, the functional film layer 110 is attached on a second substrate 200. In this embodiment, the functional film layer 110 is attached on the second substrate 200 by an adhesive material, wherein the adhesive material can be an M-bond 610 adhesive which is an ion milling resin adhesive.

Furthermore, the second substrate 200 can be a rigid substrate or a flexible substrate. Examples of the flexible substrate include, but are not limited to, plastic sheet, paper sheet, soft pad, rubber, and fabric. In other embodiments, the second substrate 200 may be a building material such as steel or tile.

Figure 7:
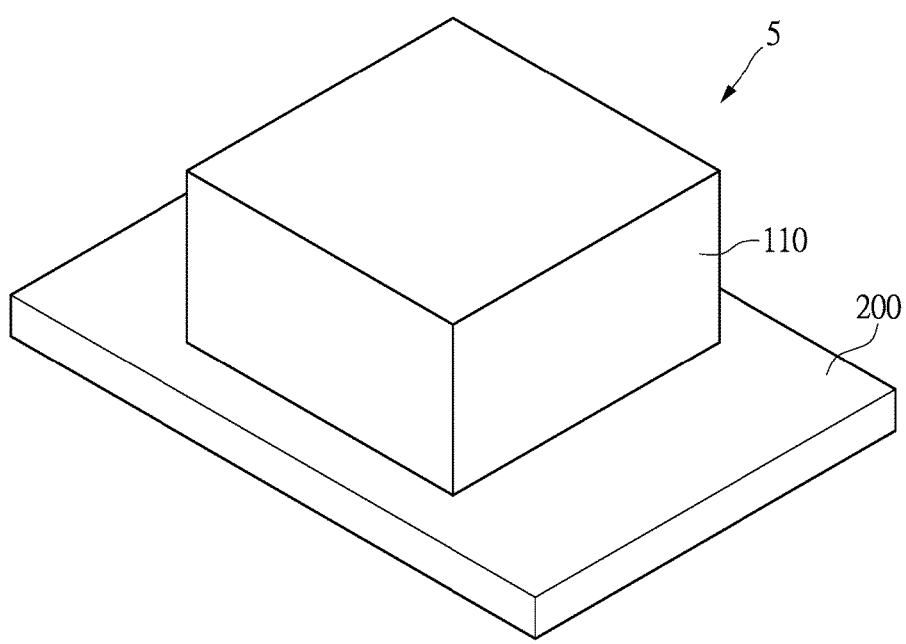
FIG. 7 shows a perspective schematic view of a second element structure in a method of transferring a thin film of an embodiment in the instant disclosure.

Finally, please refer to FIG. 7. FIG. 7 shows a perspective schematic view of a second element structure 5 in the method of transferring a thin film of the embodiment in the instant disclosure. In FIG. 7, the supporting material 2 is removed from the functional film layer 110 to obtain a second element structure 5. In an embodiment, when the supporting material 2 is attached on the functional film layer 110 by the hot-melt adhesive, an acetone can be used to remove the hot-melt adhesive, so as to separate the supporting material 2 and the functional film layer 110.

In summary, the method of transferring a thin film of this instant disclosure can be widely applied in different fields. For example, in an application of a thin film solar cell, a solar cell layer being previously formed on the soda glass substrate can be transferred on any flexible substrate. By the method of transferring a thin film of the embodiment of this instant disclosure, the solar cell layer can be formed on a variety of different substrates, so as to increase applications of the thin film solar cell.

Furthermore, in the embodiment of this instant disclosure, the solar cell layer is formed on the relatively high temperature resistant soda glass substrate first, and the solar cell layer is transferred to the flexible substrate. Therefore, compared to the solar cell layer being formed at low temperature, the solar cell layer of the embodiment of this instant disclosure has superior quality.

In addition, in the process of removing the first substrate, a removing thickness of the first substrate can be controlled by conducting the etching step and the grinding step without any etch stop layers or sacrificial layers, so as to avoid the functional film layer being damaged due to over etching.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A method of transferring a thin film, comprising:
   providing a first element structure, wherein the first element structure includes a first substrate and a functional film layer formed on the first substrate;
   completely removing the first substrate, wherein steps of the completely removing the first substrate include conducting an etching step to erode the first substrate and conducting a grinding step to planarize the eroded first substrate, and wherein the etching step and the grinding step are separately and repeatedly conducted until the first substrate is completely removed; and after completely removing the first substrate, attaching the functional film layer on a second substrate to form a second element structure without flipping the functional film layer;

wherein the first substrate is a soda glass substrate, the functional film layer is a solar cell layer, and the functional film layer includes a back electrode layer, a light absorbing layer, a buffer layer, and a transparent conductive layer, and wherein the light absorbing layer is disposed between the back electrode layer and the transparent conductive layer, and the buffer layer is disposed between the light absorbing layer and the transparent conductive layer.

2. The method of transferring a thin film as claimed in claim 1, wherein the functional film layer is a solar cell layer, a diode element layer, or a transistor element layer.

3. The method of transferring a thin film as claimed in claim 1 wherein the etching step is a wet etching process, and hydrofluoric acid is used as an etchant in the wet etching process.

4. The method of transferring a thin film as claimed in claim 1, wherein the light absorbing layer is a CIGS thin film, and the buffer layer is a sulfide layer.

5. The method of transferring a thin film as claimed in claim 1, wherein the second substrate is a flexible substrate.

6. The method of transferring a thin film as claimed in claim 1, wherein the etching step includes:

providing an etching bath and a stage, wherein the stage is disposed in the etching bath, the stage has a bearing surface and an opening formed on the bearing surface, and the etchant is received in the etching bath and the opening; and placing the first element structure on the bearing surface to cover the opening, wherein the first substrate is disposed facing to the bearing surface, and the etchant received in the etching bath and the opening contacts with the first substrate to only etch the first substrate.

7. The method of transferring a thin film as claimed in claim 1, wherein before the step of completely removing the first substrate, further comprises: attaching a supporting material on the first element structure, wherein the supporting material and the first substrate are respectively located at two opposite sides of the functional film layer.

8. The method of transferring a thin film as claimed in claim 7, wherein after the step of attaching the functional film layer on the second substrate, further comprises:

removing the supporting material.

9. A method of transferring a thin film, comprising:

providing a first element structure, wherein the first element structure includes a first substrate and a functional film layer formed on the first substrate;

completely removing the first substrate, wherein steps of the completely removing the first substrate include conducting an etching step to erode the first substrate and conducting a grinding step to planarize the eroded first substrate, and wherein the etching step and the grinding step are separately and repeatedly conducted until the first substrate is completely removed; and after completely removing the first substrate, attaching the functional film layer on a second substrate to form a second element structure without flipping the functional film layer;

wherein the functional film layer is a solar cell layer, and the functional film layer includes a salt containing layer, a back electrode layer, a light absorbing layer, a buffer layer, and a transparent conductive layer, and wherein the salt containing layer is formed between the first substrate and the back electrode layer, the light absorbing layer is disposed between the back electrode layer and the transparent conductive layer, and the buffer layer is disposed between the light absorbing layer and the transparent conductive layer.

* * * * *